METHOD FOR PRODUCING SEMICONDUCTOR DEVICES

Filed March 9, 1964 3 Sheets-Sheet 1

INVENTOR.
ROBERT E. HUNT

BY
David M. Keay
AGENT.

METHOD FOR PRODUCING SEMICONDUCTOR DEVICES

Filed March 9, 1964 3 Sheets-Sheet 2

INVENTOR.
ROBERT E. HUNT

BY David M. Keay
AGENT

METHOD FOR PRODUCING SEMICONDUCTOR DEVICES

Filed March 9, 1964 3 Sheets-Sheet 3

INVENTOR.
ROBERT E. HUNT

BY David M. Keay
AGENT.

United States Patent Office 3,298,087

Patented Jan. 17, 1967

3,298,087

METHOD FOR PRODUCING SEMICONDUCTOR DEVICES

Robert E. Hunt, Andover, Mass., assignor to Sylvania Electric Products Inc., a corporation of Delaware Filed Mar. 9, 1964, Ser. No. 350,160
6 Claims. (Cl. 29—155.5)

Figure 1:
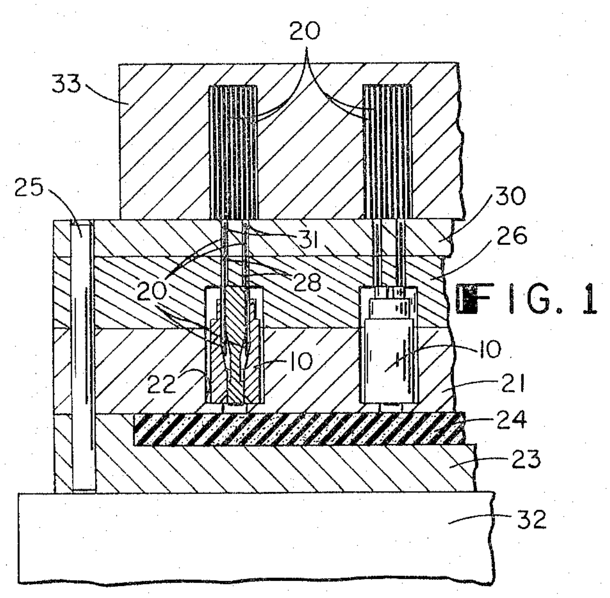

This invention relates to electrical translating devices. More particularly, it is concerned with improved methods for fabricating transistors.

Transistors commonly available as individual electrical components have electrically active elements which consist of a die or wafer of semiconductor material having regions of opposite conductivity types forming two or more rectifying junctions and ohmic contacts to the regions of different conductivity. A transistor also includes lead wires for connecting the device into an electrical circuit. Conductive leads in some form provide electrical connections between the electrodes of the electrically active elements and the lead wires. These parts are assembled in an enclosure which supports the lead wires so that they are insulated from each other and extend to the exterior of the enclosure in a desired pattern, The electrically active elements are appropriately supported within the enclosure, and the active elements and connections to the lead wires are protected by the surrounding enclosure.

One form of enclosure commonly employed for transistors has two parts. A stem or base portion of the enclosure has the lead wires passing through it arranged in a particular pattern and electrically insulated from each other. The electrically active elements are mounted on the stem and electrical connections are made between the lead wires and the electrodes of the active elements. A cover is then sealed to the stem so as to enclose the active elements, the electrical connections, and a portion of each of the lead wires.

Enclosures of the foregoing type introduce a significant element of cost into the manufacture of transistors. Several different parts must be fabricated and then assembled to produce the stem. The stem must then be handled as a separate element until it is assembled with the active elements. If the transistor if found to be defective, both the active elements and the stem are usually a complete loss. As mass-production techniques in the fabrication of the electrically active elements of transistors have improved, the portion of the cost of a transistor device represented by the cost of producing and handling the enclosure has become larger.

In order to reduce the complexity, and consequently the cost, of transistor enclosures, various techniques for enclosing transistors have been suggested. It would appear that one of the simplest forms of enclosure could be obtained by potting or encapsulating the parts of the transistor in plastic. However, proposals for enclosures of this general type require the pre-fabrication or pre-assembly of some of the parts in addition to the electrically active elements. Frequently, the lead wires or the electrical connections between the lead wires and active elements are of a particular configuration, and therefore are prepared prior to final assembly of the device. One type of encapsulated device uses a modified stem having the lead wires pre-arranged and molded in a plastic base member. The active elements are mounted on this stem, the electrical connections made, and the parts encapsulated in plastic. Although the use of these techniques reduces the costs of materials employed in the fabrication of transistors, they do not eliminate the problems associated with the preparation of preformed parts, the pre-assembly of parts, and the handling of specialized parts and sub-assemblies prior to and during the final assembly of the device.

It is an object of the present invention, therefore, to provide an improved method for producing semiconductor devices.

It is a more specific object of the invention to provide an improved method for assembling the electrically active elements of a transistor to lead wires and providing an enclosure for the transistor, which method employs parts and materials in simplified form requiring a minimum of specialized preparation and handling.

Briefly, in accordance with the foregoing objects the method of the invention includes the steps of mounting a plurality of conductive leads in a support and bonding the active elements of a semiconductor device to one of the leads. Electrical connections are made between each of the other of the leads and a different one of the electrodes of the active elements. The active elements and portions of each of the leads are sealed in a rigid non-conductive encapsulating material. The conductive leads then are separated from the support.

Figure 1A:
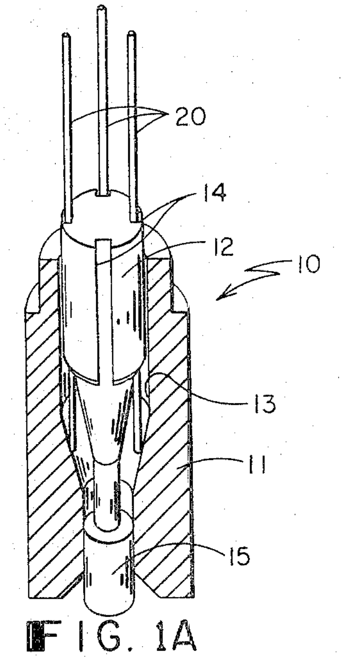
Figures 2, 3:
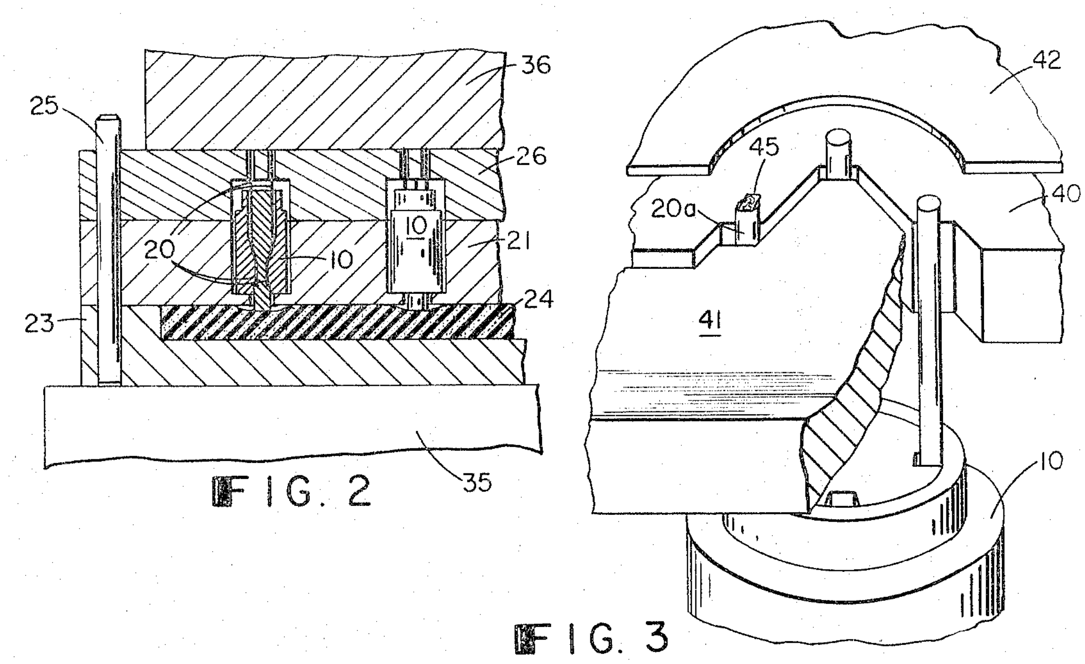
Figure 3A:
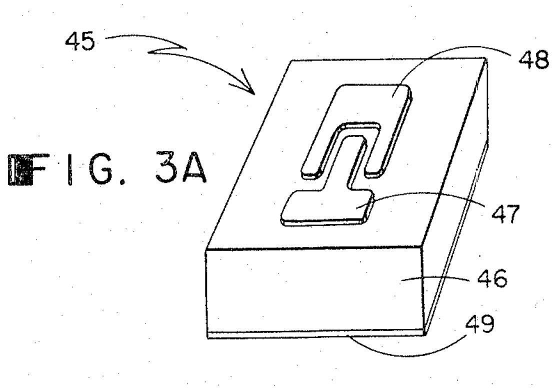
Figure 4:
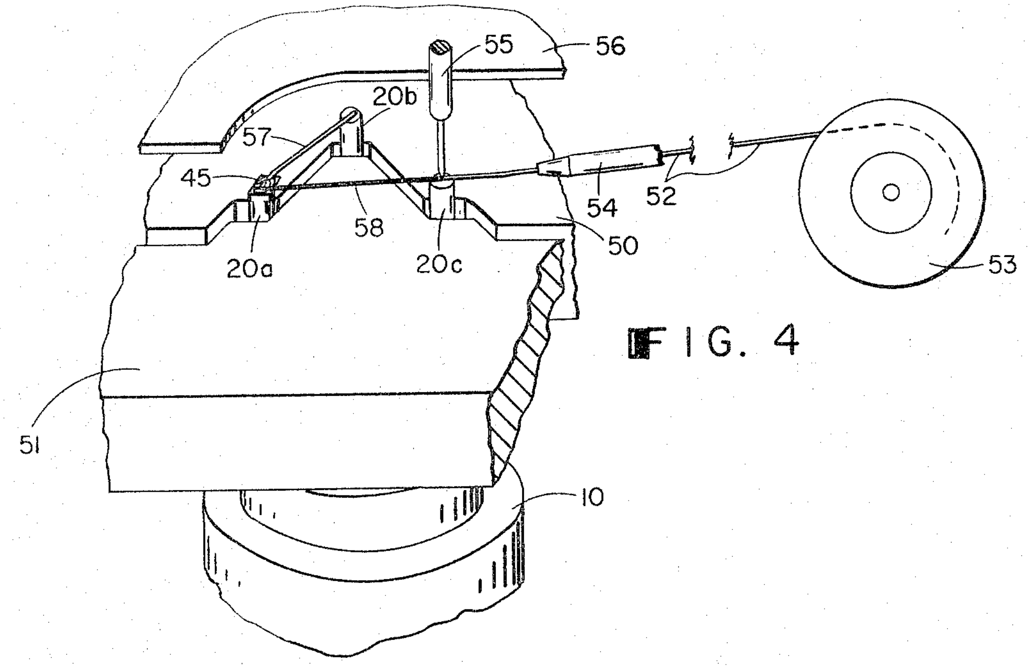
Figure 5:
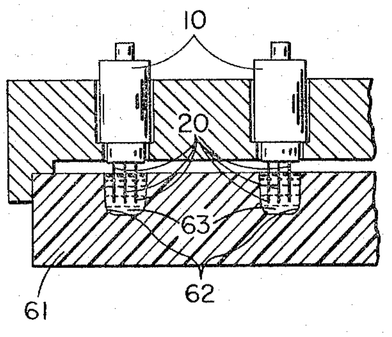
Figure 6:
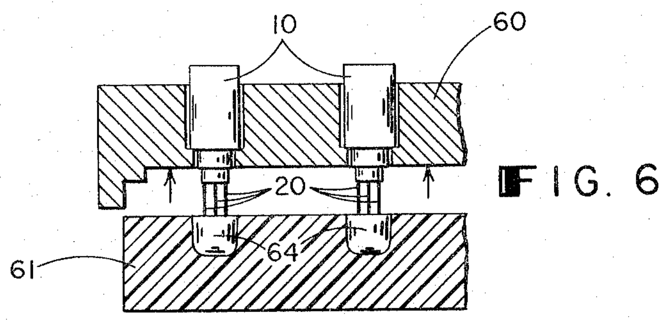

Additional objects, features, and advantages of the foregoing method of fabricating semiconductor devices will be apparent from the following detailed discussion and the accompanying drawings wherein:

FIG. 1 is an elevational view partially in cross-section illustrating the loading of transistor leads into supporting chucks, FIG. 1A is a perspective view in elevation partially in cross-section showing in more detail a single supporting chuck for holding the leads of a transistor, FIG. 2 is an elevational view partially in cross-section illustrating the positioning of the leads in the supporting chucks whereby the leads are fixedly positioned in and gripped by the supporting chucks, FIG. 3 is a fragmentary view in perspective illustrating the mounting of the active elements of a transistor in position on one of the leads held in a supporting chuck, FIG. 3A is a perspective view on a greatly enlarged scale of the electrically active elements of a double-diffused transistor shown in FIG. 3, FIG. 4 is a fragmentary view in perspective illustrating the attaching of contact wires between electrodes of the electrically active elements and the other leads, FIG. 5 is an elevational view partially in cross-section illustrating the encapsulating of the active elements, the contact wires, and the end portions of the leads in a liquid encapsulating material contained in a mold, FIG. 6 is an elevational view partially in cross-section illustrating the separating of the supporting chucks from the leads after the encapsulating material has been solidified.

Figure 7:
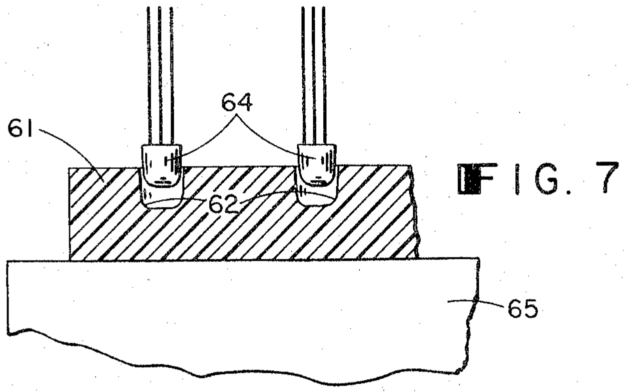
Figure 8:
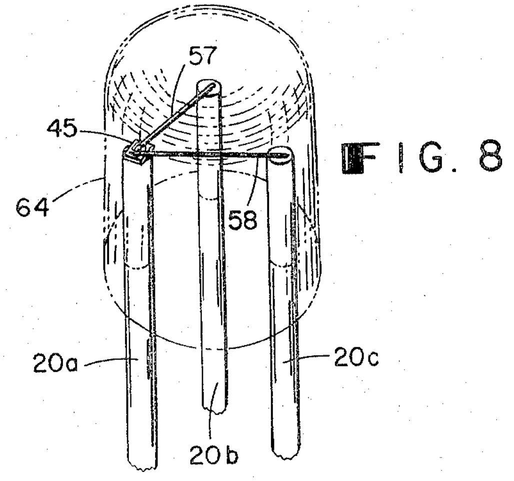

FIG. 7 is an elevational view partially in cross-section illustrating the removing of the completed transistors from the mold, and FIG. 8 is a perspective view showing the internal construction of a completed transistor with the outline of the solidified encapsulating material indicated in phantom.

FIG. 1 illustrates the loading of transistor leads from bulk into a plurality of supporting chucks 10. Each of the supporting chucks is an independent self-contained unit adapted to hold the leads for a single transistor device. A chuck is shown in more detail in the enlarged perspective view of FIG. 1A. The chuck includes a body portion 11 and a moveable piston portion 12. The body of the chuck has a cavity 13 which is of uniform area for the upper portions of its length, and tapers to a smaller uniform area at the lower portion. The piston 12 has a cylindrical upper portion in which there are four equally spaced longitudinal openings or slots 14. A tapered portion having its larger diameter adjacent the upper portion extends downward to a lower cylindrical portion. The surface of the upper end of the tapered portion meets, without offset, the surfaces of the bottoms of the slots. The piston terminates in a cylinder 15 which is flared outwardly after the piston is assembled in the body in order to prevent the piston from being removed from the body.

The tapered portions of the body and piston provide a matching locking taper, the clearance between them closing as the piston moves downward into the body. When the chuck is open with the piston in the raised position with respect to the body, there is sufficient clearance between the tapers so that leads 20 in the slots 14 can pass down until they bottom on the bottom cylinder 15 of the piston. Because of friction between the leads and the piston, downward movement of the leads causes the piston to move downward with respect to the body to its closed position unless the piston is otherwise restrained. With the piston in the closed position the leads are gripped by the mating locking tapers of the piston and body. The leads can then be forced further into the chuck only by the application of sufficient force to overcome the friction presented by the tapered portions of the piston and body. The leads are released from the chuck by movement of the piston to the open position. Because of friction between the leads and the piston, an upward pull on the leads can be used to move the piston to the open position thus releasing the leads.

A plurality of supporting chucks 10 are placed in a carrier 21 having cavities 22 for receiving them. Although only two chucks are shown, it will be appreciated that the carrier may hold as many as a few hundred arranged in rows and columns. The carrier is placed on a support 23 which has a layer of a soft resilient material 24. The carrier supports the bodies 11 of the chucks and the bottom of the pistons 12 rest on the resilient layer. The dimensions of the carrier are such that each chuck is open and in position to receive leads in its slots. In FIG. 1A the chuck is illustrated in this position. The carrier 21 is properly located with respect to the support 23 by positioning pins 25 fixed to the support and passing through openings in the carrier.

When the carrier and chucks are in position on the support, a first guide plate 26 is placed on the carrier. The guide plate has openings for receiving the positioning pins 25. Cavities 27 in the guide plate are in registration with the cavities 22 in the carrier so as to accommodate the upper portions of the chucks. The lower surface of the guide plate in these cavities is closely adjacent the upper surface of the raised piston. At each cavity there are three openings 28 through the guide plate. The pattern of the three openings corresponds to any three of the four openings in the chuck and overlie the outermost portion of the piston. A second guide plate 30 is similarly positioned by the positioning pins 25 on the first guide plate. This guide plate has a plurality of openings 31 which are in registration with the openings 28 in the first guide plate.

The support 23 with the assembled elements is placed on a vibrating bulk feeder as illustrated in FIG. 1. The feeder includes a vibrating base 32 and a bulk container 33 of device leads 20. The leads are straight conductive lengths of wire. The leads are positioned by the bulk container so that a quantity is held vertically upright in loosely packed association over the set of openings leading to each chuck. As the vibrator 32 operates leads are eventually caused to pass into each of the openings 31 and 28 extending through the guide plates. The openings are of suitable dimensions so that each will accommodate only one lead. Vibration also causes the chucks to rotate until a lead moves into one of the openings in a chuck thus preventing further rotation. The configuration of the tapers in the open chuck and the thickness of the guide plates is such that the upper ends of the leads become located intermediate the upper and lower surfaces of the second guide plate 30.

After the leads have been placed in the guide plates and chucks, the support 23 is removed from the feeder apparatus. The upper guide plate 30 is removed from the support. As shown in FIG. 2 the support and associated parts then are placed on the bed 35 of a press. The ram 36 of the press is lowered until the lower surface of the press contacts the upper surface of the guide plate 26. This action moves the leads downward into the bodies of the chucks. The configuration of the matching locking tapers of the piston and body causes the piston to be lowered because of the friction between the piston and the leads. The layer of resilient material 24 in the support permits the piston to be moved downward. With the piston in the closed position the leads are gripped by the mating locking tapers of the piston and body. The leads are forced into the chucks a distance determined by the dimensions of the carrier 21 and guide plate 26. The leads in each closed chuck are firmly held in fixed relationship with respect to each other with the leads arranged generally parallel and close to each other. Each of the leads extends above the top surface of the chuck a distance determined by the height of the surface area of the ram which contacts the lead.

The electrically active elements of a transistor are then bonded to one of the leads held in each supporting chuck. A chuck is removed from the carrier and placed in a suitable apparatus for holding the chuck and supplying the heat necessary for bonding. A portion of such an apparatus is illustrated in FIG. 3. The apparatus includes a heating plate 40 which is heated by a resistance heating element (not shown). A clamping member 41 assures that a first lead 20*a* is firmly held in contact with the heating plate. Forming gas is supplied to the region of the ends of the leads from between the heating plate and a hood 42.

For purposes of illustration the electrically active elements 45 to be bonded to the first lead constitute a double-diffused transistor as shown in FIG. 3A. This type of transistor is formed by the diffusion of a suitable conductivity type imparting material into a zone of a die 46 of semiconductor material to form a rectifying junction. Another conductivity type imparting material is then diffused into a portion of this zone to form another rectifying junction. Metallized contacts are provided to the portion of the zone and to the remainder of the zone at the upper surface of the die and to the remainder of the die at the lower surface of the die. These regions of the semiconductor die and their metal contacts serve as the emitter 47, base 48, and collector 49 electrodes, respectively, of the transistor.

The electrically active elements 45 are placed on the end surface of the first lead 20*a* of the three leads in a chuck. The end surfaces of the leads are plated with a suitable metal so that when the lead is heated by conduction from the resistance heater through the heater plate 40, the metal fuses with the metal contact of the collector electrode. Upon cooling, the die is firmly bonded to the upper surface of the lead and the lead is in electrical contact with the collector electrode. During the heating step forming gas is supplied to the heated leads and active elements to prevent oxidation.

Next, electrical connections are made from the base and emitter electrodes to the other two leads in the supporting chuck. The chuck is placed in a suitable apparatus, a portion of which is illustrated in FIG. 4. The apparatus includes a plate 50 which is heated by conduction from a resistance heater (not shown). The leads are firmly held against the plate by a clamping member 51. The configuration of the clamping member and the recess in the heating plate are such as to apply a force to each lead in a direction transverse to the length of the leads thereby urging the end portions of the leads away from each other. The extent of movement of the end portions of the leads from their normal positions is not sufficient to deform the leads permanently, and the end portions will return to their normal positions upon withdrawal of the clamping member.

The electrical connections are made by thermal compression bonding contact wires to the emitter and base electrodes and to the end surfaces of the second and third leads 20*b* and 20*c*. Fine wire 52 is fed from a supply spool or reel 53 through a tube 54 of a wire feeding mechanism (not otherwise shown). The feeder mechanism is appropriately manipulated to position the end of the wire over the base electrode with the wire overlying the end surface of the second lead 20*b*. The wire is pressed into contact against the base electrode by a wedge-shaped tool 55. The tool may be heated (heating means not shown) and the base electrode is heated by conduction from the resistance heater to the heater plate 50, first lead 20*a*, and semiconductor die. The active elements and end surfaces of the leads are protected by forming gas supplied between the heater plate 50 and a hood 56. As is well known in the art, this procedure which is called thermal compression bonding, produces a good mechanical and electrical connection between the wire and the electrode.

The tool is then maneuvered into position above the wire overlying the end surface of the second lead 20*b*. The tool is lowered to compress the wire against the lead and heat is applied to the heating plate causing the wire to bond to the lead. The wire is then broken adjacent the last bond by tension on the wire as the feeder mechanism is moved away from the lead. A contact wire 57 thus connects the base electrode to the second lead.

The entire procedure of manipulating the wire feeding mechanism and the bonding tool and applying heat is repeated to bond a second contact wire 58 between the emitter electrode of the active elements and the end surface of the third lead 20*c*. Upon withdrawal of the clamping member 51, the end portions of the leads are no longer forced apart and they are permitted to return to their normal spacing with respect to each other. Thus, any tension in the contact wires is relieved.

A plurality of supporting chucks each with electrically active elements and contact wires bonded to the leads are placed in a carrier 60 as illustrated in FIG. 5. The carrier is then positioned on a mold 61 having a plurality of cavities 62 arranged in the same pattern as the chucks in the carrier. Each of the cavities is filled with a quantity of a suitable liquid encapsulating material 63. This material may be any of various substances such as, for example, known potting plastics which can be solidified to form a rigid mass supporting the active elements, the leads, and the electrical connections. A resin of the epoxy type may be used together with an agent for preventing the curing of the resin to an infusible condition.

The carrier is supported on the mold as illustrated with the electrically active elements, contact wires, and end portions of the leads immersed in the potting material in the cavity. The potting material is then cured as by placing the carrier and mold in an oven at elevated temperature. Each quantity of potting material is thus formed into a rigid, solid mass having the electrically active elements of a transistor, the end portions of three leads, and the contact wires embedded therein.

Since the rigid mass of plastic 64 now supports the leads and holds them in position, the chucks 10 are no longer required. All the chucks are separated from the leads 20 by pulling the carrier 60 away from the mold 61 as illustrated in FIG. 6. The first movement of the leads in the chuck with respect to the body of the chuck causes the piston to move with the leads because of friction between the leads and the piston. The leads are thus released from the gripping effect of the chuck, and continued movement of the chuck away from the mold permits the leads to pass freely out of the openings in the open chuck.

The solidified masses of plastic may then be removed from the cavities of the mold as by subjecting the mold to vibration. As illustrated in FIG. 7, the mold 61 is placed on a vibrator 65. The vibrating action overcomes the frictional forces between the plastic masses 64 and the cavity walls and slowly drives the masses out of the cavities.

A completed device is illustrated in FIG. 8, the encapsulating plastic mass being shown in phantom. The three leads 20*a*, 20*b*, and 20*c* are held fixed in the rigid mass of plastic 64 so that their relative positions remain unchanged. The electrically active elements 45 are mounted on the first lead 20*a* with the collector electrode making electrical contact to the lead. The base electrode is electrically connected to the second lead 20*b* by the first contact wire 57, and the emitter electrode is electrically connected to the third lead 20*c* by the second contact wire 58. The plastic mass not only supports the leads in position, but otherwise serves as the device enclosure by surrounding the active elements and the electrical connections from the active elements to the leads thereby providing protection for these critical parts and their connections.

As can be seen, the parts of the device are few in number and of extremely simple configuration. In addition to the electrically active elements the device includes three straight conductive leads which are readily obtained in quantity from wire and are easily handled in bulk. The two pieces of contact wire are taken from a continuous supply on a reel at the point of their utilization. The quantity of encapsulating material is prepared in bulk and the mold cavities are loaded in a batch operation. The parts and materials employed in the fabrication of a transistor according to the invention are simple in form and require a minimum of specialized preparation and handling.

In a typical example according to the method of the invention, conductive leads each .650 inch in length were prepared from Kovar wire .019 inch in diameter and were plated with gold. Three leads were loaded in each of a plurality of supporting chucks 10 as illustrated in FIGS. 1 and 2. The leads in a chuck were arranged on a circle approximately .100 inch in diameter with the first and third leads 20*a* and 20*c* at opposite ends of a diameter and the second lead 20*b* equally distant from the other two. The leads extended approximately .190 inch above the top surface of the chuck.

The electrically active transistor elements 45 which were attached to the end surface of the first lead were fabricated of a die of silicon approximately 15 mils square and 6 mils thick. The major portion of the die constituting the collector region was of N-type conductivity. A P-type base region and an N-type emitter region were formed in the die by two successive diffusions of conductivity type imparting materials. A gold plating 49 on the bottom surface of the die provided a contact for the collector region, and aluminum was vacuum deposited on the upper surface to provide contacts 48 and 47 to the base and emitter regions, respectively.

The active elements were placed on the end surface of the first lead 20*a* with the collector contact downward. The first lead was heated to approximately 500° C. (above the melting point of the silicon-gold eutectic) to bond the die to the lead. The contact wires 57 and 58 were aluminum wire 0.7 mil in diameter and were attached to the aluminum contacts and to the end surfaces of the leads by thermal compression bonding. During these steps the surfaces to which the wires were bonded were heated to approximately 325° C.

The mold 61 containing the encapsulating material was of Teflon and the cavities 62 were approximately .180 inch in diameter by .180 inch deep. The cavities were filled with a potting material 63 consisting of 90% by weight of an epoxy casting resin sold under the trade name of Stycast #2762 by Emerson and Cuming, Inc., Canton, Massachusetts, and 10% by weight of a curing agent sold under the trade name of Catalyst #17 also by Emerson and Cuming, Inc. The casting resin included approximately 80% by weight of alumina. The active elements, contact wires, and end portions of the leads were immersed in the filled epoxy resin and heated at a temperature of 150° C. for about 2 hours to cure the potting material to a rigid mass. In the finished device the leads extended beyond the plastic enclosure for a distance of about ½ inch.

What is claimed is:

1. The method of producing a semiconductor device including the steps of mounting a plurality of straight conductive leads in fixed position in a supporting chuck with the leads generally parallel to each other, bonding the active elements of a semiconductor device at one end of one of said leads with the lead in ohmic contact with one of the electrodes of the active elements, connecting contact wires between each of the other electrodes of the active elements and one end of different ones of said leads, surrounding the active elements, the contact wires, and a portion of each of said leads including the one ends with a non-conductive liquid encapsulating material, curing the liquid encapsulating material to a rigid mass having the active elements, contact wires, and portions of the leads embedded therein, and separating said supporting chuck from said leads.

2. The method of producing a semiconductor device including the steps of placing three straight conductive leads in predetermined locations in an open supporting chuck with the leads generally parallel to each other, closing said chuck to grip said leads in said chuck and maintain the leads fixed with respect to each other, bonding the active elements of a semiconductor transistor having one surface including a first electrode of the transistor and having an opposite surface including the second and third electrodes of the transistor on the end surface of a first of said leads with said first electrode in ohmic electrical contact with the end surface, bonding a first contact wire to the second electrode of the transistor and to the end surface of a second of said leads, bonding a second contact wire to the third electrode of the transistor and to the end surface of the third of said leads, immersing the active elements of the transistor, the contact wires, and a portion of each of said leads including said end surfaces in a non-conductive encapsulating material in the liquid state, hardening said encapsulating material to embed said active elements, contact wires, and portions of the leads in a rigid, solid, non-conductive mass, and opening said supporting chuck to release said leads from the chuck.

3. The method of producing a semiconductor device including the steps of placing three straight conductive leads of substantially equal length in an open supporting chuck, said chuck being adapted to receive the leads generally parallel to each other when open and being adapted to grip the leads when closed, closing said supporting chuck to grip the leads and maintain the leads fixed with respect to each other, bonding the active elements of a transistor comprising a die of semiconductor material having two flat, parallel, opposed major surfaces, one of said major surfaces of the die including a collector electrode of the transistor and the other of said major surfaces including an emitter electrode and a base electrode, on an end surface of a first of said leads with the collector electrode in ohmic contact with the end surface, bonding a first contact wire to the emitter electrode and to the end surface of a second of said leads, bonding a second contact wire to the base electrode and to the end surface of the third of said leads, immersing the active elements of the transistor, the contact wires, and portions of the three leads including the end surfaces in a quantity of a liquid epoxy resin, curing the liquid epoxy resin to form a rigid body of plastic having the active elements, contact wires, and portions of the leads embedded therein in fixed relationship, and opening said supporting chuck to release said leads from the chuck.

4. The method of producing a semiconductor device including the steps of placing three straight conductive lead wires of substantially equal length in openings in a supporting chuck, the chuck being open and adapted to receive the lead wires, the lead wires being placed generally parallel to each other, closing the chuck to grip said lead wires in said chuck and maintain the lead wires fixed with respect to each other, bonding the active elements of a double-diffused transistor comprising a die of semiconductor material having two flat, parallel, opposed major surfaces, one of said major surfaces of the die including the collector electrode of the transistor and the other of said major surfaces including the emitter and base electrodes, on the surface of the first end of a first of said lead wires with the collector electrode in ohmic contact with the end surface, bonding a first contact wire to the emitter electrode and to the surface of the first end of a second of said lead wires, bonding a second contact wire to the base electrode and to the surface of the first end of the third of said lead wires, immersing the active elements of the transistor, the contact wires, and a portion of the length of each lead wire including said first ends in a quantity of a liquid epoxy resin contained in a mold cavity, curing the liquid epoxy resin to form a rigid mass of plastic having the active elements, the contact wires, and said portions of the lead wires embedded therein, removing said mass of plastic from the mold cavity, opening the supporting chuck to release the lead wires from being gripped by the chuck, and removing the lead wires from the openings in the supporting chuck, the lead wires being held in fixed relationship with respect to each other by the rigid mass of plastic.

5. The method of producing a plurality of semiconductor devices including the steps of arranging a plurality of supporting chucks in association with a feeding mechanism containing a quantity of uniform, straight, conductive lead wires, each of said chucks being adapted to be opened to receive three lead wires in openings with the lead wires generally parallel to each other and being adapted to be closed to grip lead wires in said openings, said chucks being open, placing three lead wires from the feeding mechanism in the openings in each of the plurality of supporting chucks at the same time, closing each of the plurality of supporting chucks at the same time whereby the lead wires are gripped by the chucks and the lead wires in each supporting chuck are maintained fixed with respect to each other, bonding the active elements of a double-diffused transistor comprising a die of semiconductor material having two flat, parallel, opposed major surfaces, one of said major surfaces of the die including the collector electrode of the transistor and the other of said major surfaces including the emitter and base electrodes, on an end surface of a first of said lead wires in each supporting chuck in succession with the one of said major surfaces of the die in ohmic contact with the first lead, bonding a first contact wire to the emitter electrode and to the end surface of a second of said lead wires, and bonding a second contact wire to the base electrode and to the end surface of a third of said lead wires in each supporting chuck in succession, placing the plurality of supporting chucks in a predetermined array in a chuck carrier, placing a quantity of a liquid epoxy resin in each of a plurality of cavities in a mold, said cavities being arranged in the same predetermined array as the chucks in the carrier, immersing the active elements of the transistor, the contact wires, and the end portions of the three lead wires in each supporting chuck in a quantity of the liquid epoxy resin contained in the mold cavities at the same time, curing the plurality of quantities of liquid epoxy resin at the same time to form a plurality of rigid masses of plastic each having the active elements, the contact wires, and said portions of the three lead wires in a supporting chuck embedded therein, removing said masses of plastic from the cavities of the mold, opening the supporting chucks whereby the lead wires are released from being gripped by the chucks, and removing the lead wires from the openings in the supporting chucks, the lead wires being held in fixed relationship wtih respect to each other by the rigid masses of plastic.

6. The method of producing a semiconductor device including the steps of placing three straight conductive leads of substantially equal length in an open supporting chuck, said chuck being adapted to receive the leads with the leads generally parallel to each other when open and being adapted to grip the leads when closed, closing said supporting chuck to grip the leads and maintain the leads fixed with respect to each other, bonding the active elements of a transistor comprising a die of semiconductor material having two flat, parallel, opposed major surfaces, one of said major surfaces of the die including a collector electrode of the transistor and the other of said major surfaces including an emitter electrode and a base electrode, on an end surface of a first of said leads with the collector electrode in ohmic contact with the end surface, urging the end portions of the three leads from their normal positions in directions away from each other, bonding a first contact wire to the emitter electrode and to the end surface of a second of said leads while the end portions of the leads are being urged away from each other, bonding a second contact wire to the base electrode and to the end surface of the third of said leads while the end portions of the leads are being urged away from each other, permitting the end portions of the leads to return to their normal positions whereby tension in the contact wires is relieved, immersing the active elements of the transistor, the contact wires, and portions of the three leads including the end surfaces in a quantity of a liquid epoxy resin, curing the liquid epoxy resin to form a rigid body of plastic having the active elements, contact wires, and portions of the leads embedded therein in fixed relationship, and opening said supporting chuck to release said leads from the chuck.

References Cited by the Examiner

UNITED STATES PATENTS

| | | | |
|---|---|---|---|
| 2,720,617 | 10/1955 | Sardella | 264—272 X |
| 2,888,736 | 6/1959 | Sardella | 264—272 X |
| 3,080,640 | 3/1963 | Jochems | 29—155.5 |
| 3,084,391 | 4/1963 | Parstorfer | 264—272 X |
| 3,092,522 | 6/1963 | Knowles. | |
| 3,187,240 | 6/1965 | Clark | 29—155.5 X |

JOHN F. CAMPBELL, *Primary Examiner.*

WILLIAM I. BROOKS, *Examiner.*